US012568762B2

(12) United States Patent
Oguchi et al.

(10) Patent No.: US 12,568,762 B2
(45) Date of Patent: Mar. 3, 2026

(54) PIEZOELECTRIC ELEMENT WITH INTERNAL ELECTRODE HAVING ELECTRODE PORTIONS AND CONNECTOR

(71) Applicant: TDK CORPORATION, Tokyo (JP)

(72) Inventors: Keiji Oguchi, Tokyo (JP); Yasuyuki Satoh, Tokyo (JP); Satoshi Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 1106 days.

(21) Appl. No.: 17/559,245

(22) Filed: Dec. 22, 2021

(65) Prior Publication Data

US 2022/0209099 A1     Jun. 30, 2022

(30) Foreign Application Priority Data

Dec. 25, 2020    (JP) ................................. 2020-216439

(51) Int. Cl.
| | |
|---|---|
| *H01L 41/312* | (2013.01) |
| *H01L 41/047* | (2006.01) |
| *H10N 30/072* | (2023.01) |
| *H10N 30/87* | (2023.01) |

(52) U.S. Cl.
CPC ......... *H10N 30/072* (2023.02); *H10N 30/871* (2023.02); *H10N 30/875* (2023.02)

(58) Field of Classification Search
CPC ... H10N 30/072; H10N 30/871; H10N 30/875
USPC ...................................................... 310/313 B
See application file for complete search history.

(56) References Cited

U.S. PATENT DOCUMENTS

2008/0278033 A1* 11/2008 Adachi .................. H10N 30/50
                                                  310/317
2009/0021114 A1    1/2009 Adachi

FOREIGN PATENT DOCUMENTS

WO        2007/091443 A1    8/2007

* cited by examiner

*Primary Examiner* — Emily P Pham
*Assistant Examiner* — Monica Mata

(57)            ABSTRACT
A piezoelectric element includes a laminate and a first internal electrode. The laminate includes a pair of main faces, a pair of end faces, and a pair of side faces. The first internal electrode includes four electrode portions and a connector. The four electrode portions include a first pair of electrode portions and a second pair of electrode portions. The connector connects the first pair of electrode portions. The connector is spaced apart from each of the second pair of electrode portions by a first distance. Each of the four electrode portions includes a main electrode part. The main electrode part is spaced apart from the pair of end faces by a second distance. The main electrode part is spaced apart from the pair of side faces by a third distance. The first distance is longer than each of the second distance and the third distance.

6 Claims, 8 Drawing Sheets

PIEZOELECTRIC ELEMENT WITH INTERNAL ELECTRODE HAVING ELECTRODE PORTIONS AND CONNECTOR

TECHNICAL FIELD

The present disclosure relates to a piezoelectric element.

BACKGROUND

WO2007/091443 discloses a piezoelectric element which at least bends and vibrates and is used as an actuator. The piezoelectric element includes a laminate in which piezoelectric layers and internal electrodes are alternately laminated, and external electrodes disposed on an outer surface of the laminate. In this piezoelectric element, the internal electrode includes four divided electrodes and a connecting electrode connecting a pair of divided electrodes positioned diagonally. As a result, the number of wires connected to the external electrode is reduced to suppress inhibition of vibration of the piezoelectric element.

SUMMARY

An aspect of the present disclosure provides a piezoelectric element capable of improving a displacement amount.

A piezoelectric element according to an aspect of the present disclosure includes a laminate, a first internal electrode, a second internal electrode, and a plurality of external electrodes. The laminate includes a plurality of piezoelectric layers that is laminated. The first internal electrode and the second internal electrode are disposed in the laminate and alternately laminated in a laminating direction of the plurality of piezoelectric layers via a piezoelectric layer of the plurality of piezoelectric layers. The laminate includes a pair of main faces facing away from each other in the laminating direction, a pair of end faces facing away from each other in a first direction crossing the laminating direction, and a pair of side faces facing away from each other in a second direction crossing the laminating direction and the first direction.

The first internal electrode includes four electrode portions and a connector. The four electrode portions are arranged in two rows in each of the first direction and the second direction. The four electrode portions include a first pair of electrode portions positioned diagonally to each other and a second pair of electrode portions positioned diagonally to each other. The connector connects the first pair of electrode portions. The connector is spaced apart from each of the second pair of electrode portions by a first distance. Each of the four electrode portions includes a main electrode part. The main electrode part is spaced apart from the pair of end faces by a second distance. The main electrode part is spaced apart from the pair of side faces by a third distance. The first distance is longer than each of the second distance and the third distance.

In the piezoelectric element, the first internal electrode includes the connector that connects the first pair of electrode portions. The first pair of electrode portions are positioned diagonally. Therefore, in the piezoelectric layer, not only a region overlapping the four electrode portions but also a region overlapping the connector as viewed from the laminating direction are piezoelectrically active regions. The region overlapping the connector is a region serving as a node of bending vibration of the piezoelectric element. Nevertheless, if the region overlapping the connector becomes the active region and vibrates, the vibration of the active region caused by the electrode portion may be inhibited. Therefore, in the piezoelectric element, the connector is disposed to be spaced apart from the second pair of electrode portions by the first distance. The first distance is longer than each of the second distance, which is a distance between the main electrode part of the electrode portion and the end face, and the third distance, which is a distance between the main electrode part of the electrode portion and the side face. Therefore, compared to a case where the first distance is equal to or less than each of the second distance and the third distance, vibration of the active region caused by the connector can be suppressed. Accordingly, it is suppressed that the vibration of the active region caused by the electrode portion is inhibited. Therefore, the displacement amount can be improved.

A pair of the main electrode parts adjacent to each other in the first direction may be spaced apart from each other by a fourth distance. The fourth distance may be longer than each of the second distance and the third distance. In this case, a sufficient gap can be left between the pair of main electrode parts adjacent to each other in the first direction. Therefore, since a region corresponding to the gap in the piezoelectric layer becomes a node of bending vibration, the piezoelectric element can be stably bent and vibrated.

The second distance and the third distance may be equal to each other. In this case, distances from the end face and the side face of the piezoelectric element to the active region are the same. Therefore, the displacement is well balanced. Therefore, the piezoelectric element can be efficiently bent and vibrated.

A pair of the main electrode parts adjacent to each other in the second direction may be spaced apart from each other by a fifth distance. The fifth distance may be equal to the second distance and the third distance. In this case, since the fifth region is shorter than the first distance, the size of the active region caused by the electrode portion is easily ensured.

A piezoelectric element according to another aspect of the present disclosure includes a laminate, a first internal electrode, a second internal electrode, and a plurality of external electrodes. The laminate includes a plurality of piezoelectric layers that is laminated. The first internal electrode and the second internal electrode are disposed in the laminate and alternately laminated in a laminating direction of the plurality of piezoelectric layers via a piezoelectric layer of the plurality of piezoelectric layers. The laminate includes a pair of main faces facing away from each other in the laminating direction, a pair of end faces facing away from each other in a first direction crossing the laminating direction, and a pair of side faces facing away from each other in a second direction crossing the laminating direction and the first direction. The first internal electrode includes four electrode portions and a connector. The four electrode portions are arranged in two rows in each of the first direction and the second direction. The four electrode portions include a first pair of electrode portions positioned diagonally to each other and a second pair of electrode portions positioned diagonally to each other. The connector connects the first pair of electrode portions. The connector is spaced apart from each of the second pair of electrode portions by a first distance. Each of the four electrode portions includes a main electrode part. A pair of main electrode parts adjacent to each other in the second direction are spaced apart from each other in a fifth distance. The first distance is longer than the fifth distance.

In the piezoelectric element, the first internal electrode includes the connector that connects the first pair of electrode portions. The first pair of electrode portions are positioned diagonally. Therefore, in the piezoelectric layer, not only a region overlapping the four electrode portions but also a region overlapping the connector as viewed from the laminating direction are piezoelectrically active regions. The region overlapping the connector is a region serving as a node of bending vibration of the piezoelectric element. Nevertheless, if the region overlapping the connector becomes the active region and vibrates, the vibration of the active region caused by the electrode portion may be inhibited. Therefore, in the piezoelectric element, the connector is disposed to be spaced apart from a second pair of electrode portions by the first distance. The first distance is longer than a fifth distance, which is a distance between the pair of main electrode parts adjacent to each other in the second direction. Therefore, compared to a case where the first distance is equal to or less than the fifth distance, the vibration of the active region caused by the connector can be suppressed. Accordingly, it is suppressed that the vibration of the active region caused by the electrode portion is inhibited. Therefore, the displacement amount can be improved.

The first distance may be ½ times or more and less than 1 times a width of the connector. In this case, since the first distance is ½ times or more the width of the connector, the active region caused by the connector can be sufficiently spaced apart from the active region caused by the electrode portion. Since the first distance is less than 1 times the width of the connector, the size of the active region caused by the electrode portion is easily ensured.

DETAILED DESCRIPTION

Figure 1:
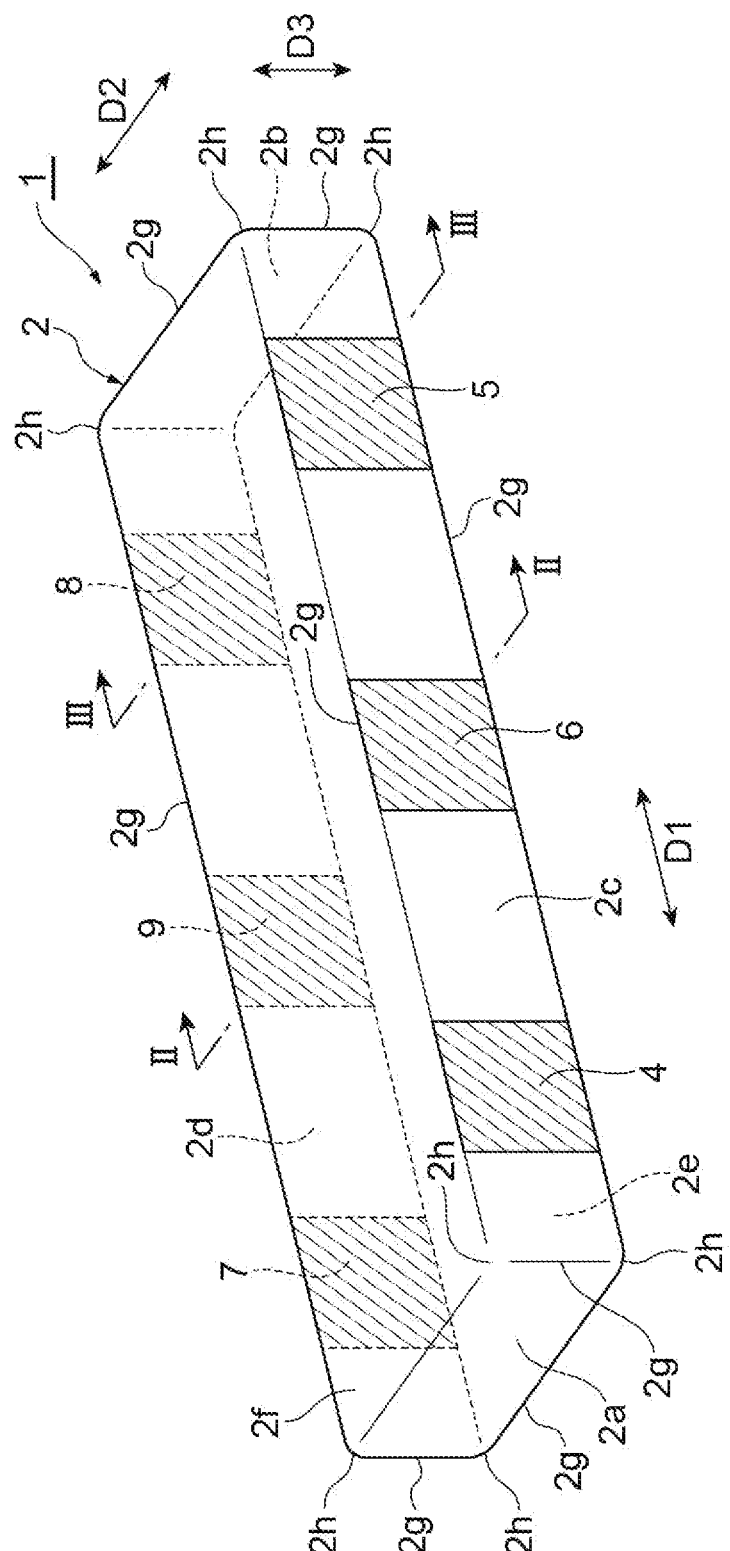
FIG. 1 is a perspective view illustrating a piezoelectric element according to an embodiment.

Hereinafter, embodiments of the present invention will be described in detail with reference to the accompanying drawings. In the following description, the same elements or elements having the same functions are denoted with the same reference numerals and overlapped explanation is omitted.

FIG. 1 is a perspective view illustrating a piezoelectric element according to an embodiment. The piezoelectric element 1 shown in FIG. 1 is used as a piezoelectric actuator. The piezoelectric element 1 has a function of at least bending vibration and moving a driven body when an AC voltage is applied. The piezoelectric element 1 includes a laminate 2 and a plurality of external electrodes 4, 5, 6, 7, 8 and 9. The laminate 2 has a rectangular parallelepiped shape. The rectangular parallelepiped shape includes a rectangular parallelepiped shape in which corner portions and ridge portions are chamfered and a rectangular parallelepiped shape in which corner portions and ridge portions are rounded. The laminate 2 includes a pair of end faces 2a and 2b facing away from each other, a pair of side faces 2c and 2d facing away from each other, and a pair of main faces 2e and 2f facing away from each other.

A direction D1 in which the end faces 2a and 2b faces away from each other, a direction D2 in which the side faces 2c and 2d faces away from each other, a direction D3 in which the main faces 2e and 2f faces away from each other intersect each other. In the present embodiment, the direction D1, the direction D2, and the direction D3 are orthogonal to each other. The direction D1 is the length direction of the laminate 2. The direction D2 is the width direction of the laminate 2. The direction D3 is the thickness direction of the laminate 2. The main faces 2e and 2f have a rectangular shape. The long side directions of the main faces 2e and 2f coincide with the direction D1. The short side directions of the main faces 2e and 2f coincide with the direction D2.

The end faces 2a and 2b extend in the width direction (direction D2) of the laminate 2 so as to connect the side faces 2c and 2d. The end faces 2a and 2b also extend in the thickness direction (direction D3) of the laminate 2 so as to connect the main faces 2e and 2f. The side faces 2c and 2d extend in the length direction (direction D1) of the laminate 2 so as to connect the end faces 2a and 2b. The side faces 2c and 2d also extend in the thickness direction of the laminate 2 so as to connect the main faces 2e and 2f. The main faces 2e and 2f extend in the length direction of the laminate 2 so as to connect the end faces 2a and 2b. The main faces 2e and 2f also extend in the width direction of the laminate 2 so as to connect the side faces 2c and 2d.

The width (length in the direction D2) of the laminate 2 is, for example, 2.5 mm. The length of the laminate 2 (the length in the direction D1) is, for example, 9 mm. The thickness (length in the direction D3) of the laminate 2 is, for example, 1 mm. The width of laminate 2 is greater than the thickness of laminate 2 and less than the length of laminate 2.

Each of the faces 2a, 2b, 2c, 2d, 2e and 2f of the laminate 2 is a polished surface polished by barrel polishing, for example. Each ridge portion 2g located between two adjacent faces of the faces 2a, 2b, 2c, 2d, 2e and 2f has a rounded chamfered shape. Each ridge portion 2g is constituted by a curved surface. Each corner portion 2h located among three adjacent faces of the faces 2a, 2b, 2c, 2d, 2e and 2f has a rounded chamfered shape. Each corner portion 2h is constituted by a curved surface. The radii of curvature of the ridge portion 2g and the corner portion 2h are, for example, 0.03 mm or more and 0.15 mm or less.

The external electrodes 4, 5, and 6 are disposed on the side face 2c of the laminate 2. The external electrodes 4, 5, and 6 are spaced apart from each other. The external electrodes 4, 5, and 6 are arranged side by side in the direction D1. The external electrode 4 is disposed on the end face 2a side. The external electrode 4 is spaced apart from the end face 2a. The external electrode 5 is disposed on the end face 2b side. The external electrode 5 is spaced apart from the end face 2b. The external electrode 6 is disposed between the external electrode 4 and the external electrode 5. The external electrode 6 is spaced apart from each of the external electrode 4 and the external electrode 5.

The external electrodes 4, 5, and 6 have the same shape. The external electrodes 4, 5, and 6 have a rectangular shape when viewed from the direction D2. Each of the external electrodes 4, 5, and 6 extends in the direction D3 so as to connect the main face 2e and the main face 2f. Each of the external electrodes 4, 5, and 6 is formed over the entire side face 2c in the direction D3. Each of the external electrodes 4, 5, and 6 is also disposed in the ridge portion 2g between the side face 2c and the main face 2e and in the ridge portion 2g between the side face 2c and the main face 2f.

The external electrodes 7, 8 and 9 are disposed on the side face 2d of the laminate 2. The external electrodes 7, 8 and 9 are spaced apart from each other. The external electrodes 7, 8 and 9 are arranged side by side in the direction D1. The external electrode 7 is disposed on the end face 2a side. The external electrode 7 is spaced apart from the end face 2a. The external electrode 8 is disposed on the end face 2b side. The external electrode 8 is spaced apart from the end face 2b. The external electrode 9 is disposed between the external electrode 7 and the external electrode 8. The external electrode 9 is spaced apart from each of the external electrode 7 and the external electrode 8.

The external electrodes 7, 8 and 9 have the same shape. The external electrodes 7, 8 and 9 have a rectangular shape when viewed from the direction D2. Each external electrode 7, 8 and 9 extends in the direction D3 so as to connect the main face 2e and the main face 2f. Each external electrode 7, 8 and 9 is formed over the entire side face 2d in the direction D3. Each external electrode 7, 8 and 9 is also disposed in the ridge portion 2g between the side face 2d and the main face 2e and in the ridge portion 2g between the side face 2d and the main face 2f.

The external electrode 4 and the external electrode 7 oppose each other in the direction D2. The external electrode 4 and the external electrode 7 are disposed so as to overlap each other when viewed from the direction D2. The external electrode 5 and the external electrode 8 oppose each other in the direction D2. The external electrode 5 and the external electrode 8 are disposed so as to overlap each other when viewed from the direction D2. The external electrode 6 and the external electrode 9 oppose each other in the direction D2. The external electrode 6 and the external electrode 9 are disposed so as to overlap each other when viewed from the direction D2.

The external electrodes 4, 5, 6, 7, 8 and 9 are formed on the side faces 2c and 2d by sputtering, for example. The external electrodes 4, 5, 6, 7, 8 and 9 may be formed by an evaporation method. Examples of the film structure constituting the external electrodes 4, 5, 6, 7, 8 and 9 include Cr/Ni, NiCu/Ag, SnAg, and Au. The thicknesses of the external electrodes 4, 5, 6, 7, 8 and 9 are, for example, 0.5 μm or more and 2.5 μm or less. The lengths of the external electrodes 4, 5, 6, 7, 8 and 9 in the direction D1 are, for example, 1 mm or more and 1.5 mm or less.

The external electrodes 4, 5, 6, 7, 8 and 9 may be fired electrode layers formed by firing a conductive paste. As the conductive paste, a conductive paste containing a conductive material containing Ag as a main component can be used. The external electrodes 4, 5, 6, 7, 8 and 9 may further include a plating layer formed by electroplating. Examples of the plating layer include a Ni/Au plating layer.

Figure 2:
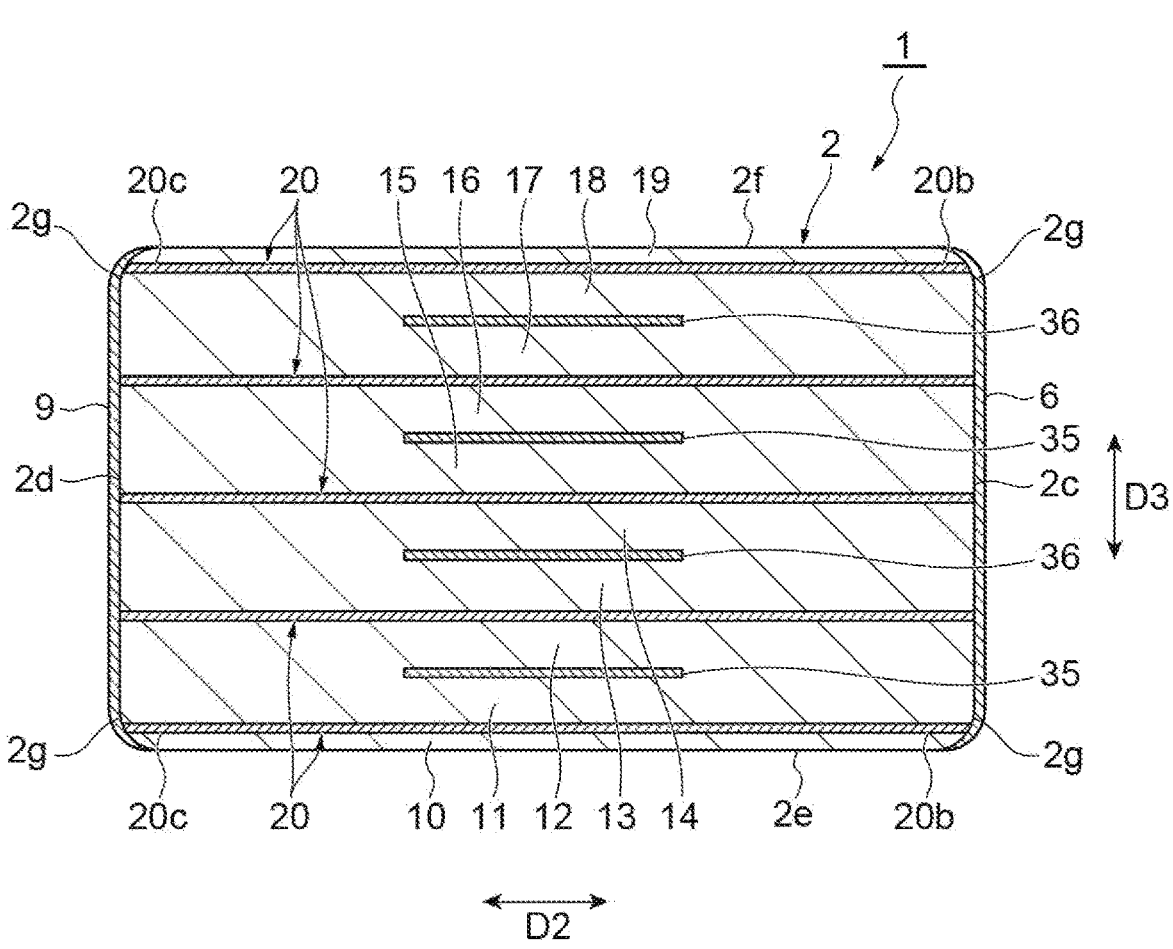
FIG. 2 is a cross-sectional view taken along line II-II of FIG. 1.
Figure 3:
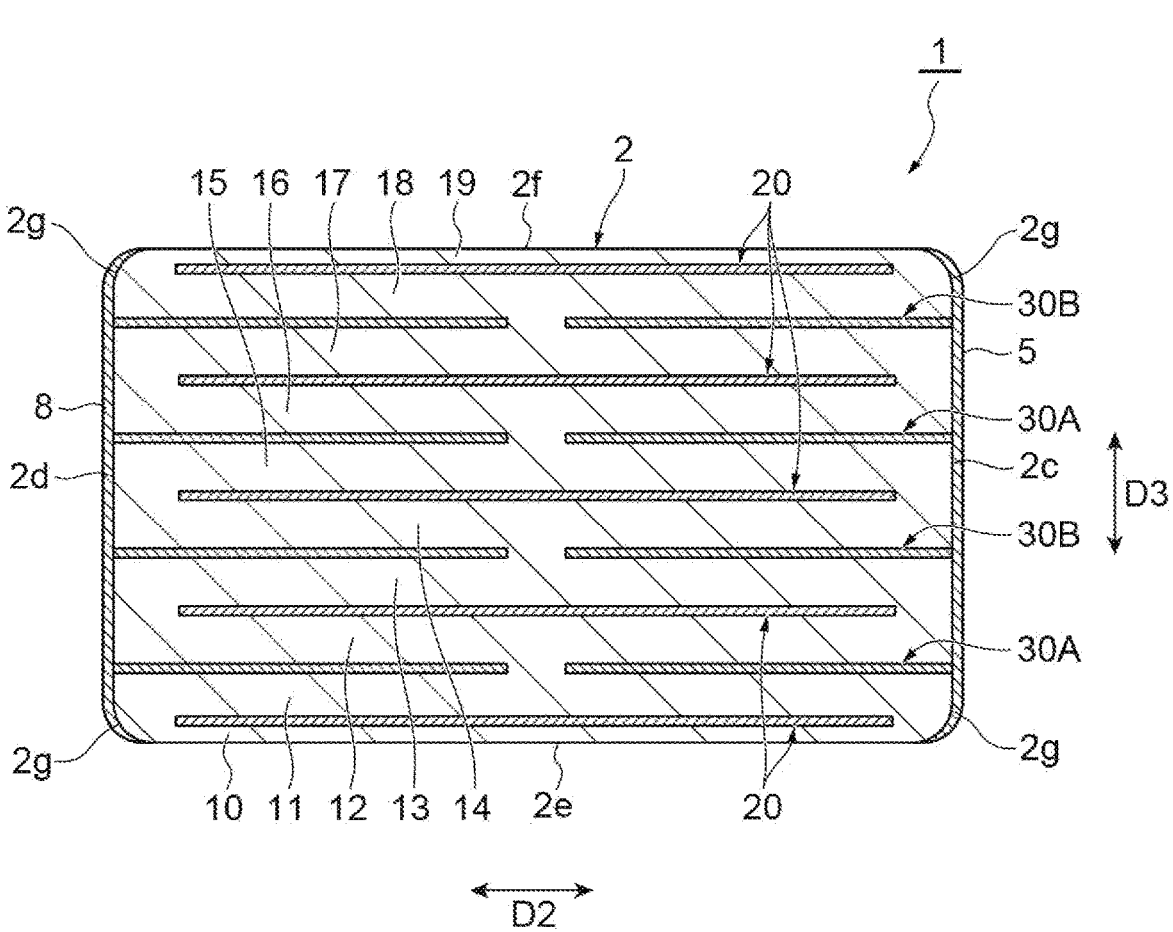
FIG. 3 is a cross-sectional view taken along line III-III of FIG. 1.
Figure 4:
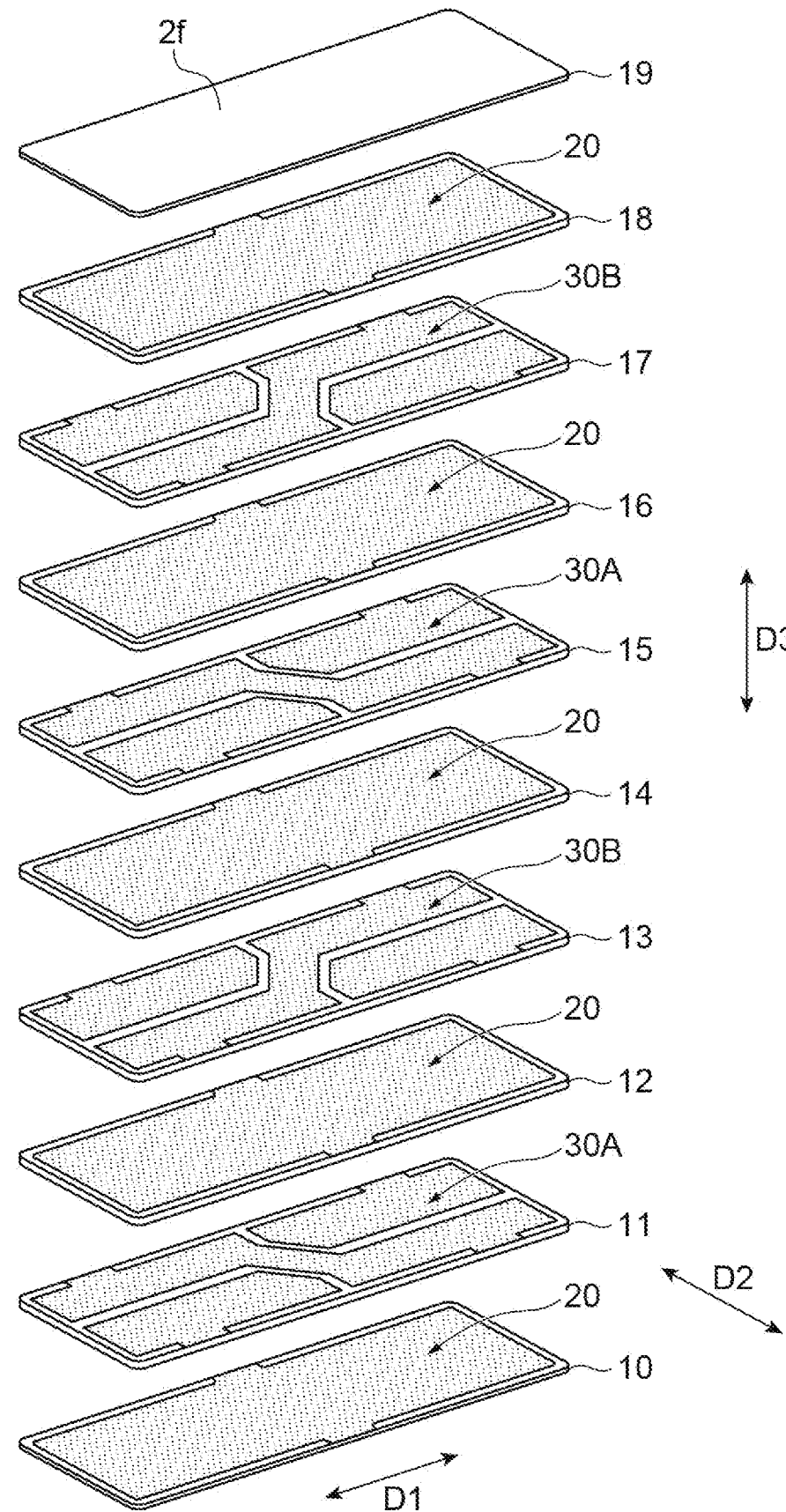
FIG. 4 is an exploded perspective view of the piezoelectric element of FIG. 1.

FIG. 2 is a cross-sectional view taken along line II-II of FIG. 1. FIG. 3 is a cross-sectional view taken along line III-III of FIG. 1. FIG. 4 is an exploded perspective view of the piezoelectric element of FIG. 1. As shown in FIG. 4, the laminate 2 includes piezoelectric layers 10 to 19 laminated in the direction D3. The laminate 2 is formed by laminating piezoelectric layers 10 to 19 in the direction D3. The laminating direction of the piezoelectric layers 10 to 19 coincides with the direction in which the main faces 2e and 2f faces away from each other. The piezoelectric layers 10 to 19 have a rectangular plate shape.

The piezoelectric layers 10 and 19 are disposed at both ends in the laminating direction (direction D3). The outer surface of the piezoelectric layer 10 constitutes the main face 2e. The outer surface of the piezoelectric layer 19 constitutes the main face 2f. The piezoelectric layers 11 to 18 are disposed between the piezoelectric layers 10 and 19 in the laminating direction. The thickness (length in the direction D3) of each of the piezoelectric layers 10 and 19 disposed at both ends in the laminating direction is thinner than the thickness (length in the direction D3) of each of the piezoelectric layers 11 to 18 disposed between the piezoelectric layers 10 and 19. The thickness of each of the piezoelectric layers 11 to 18 is, for example, 4 times or more and 8 times or less the thickness of each of the piezoelectric layers 10 and 19.

The thicknesses of the piezoelectric layers 10 and 19 are smaller than the radius of curvature of the ridge portion 2g. The radius of curvature of the ridge portion 2g is, for example, greater than 1 times and less than or equal to 5 times the thickness of each piezoelectric layers 10 and 19. The thickness of the piezoelectric layers 10 and 19 is, for example, 0.02 μm or more and 0.03 μm or less. In the laminating direction, the thicknesses of the piezoelectric layers 11 to 18 are, for example, 0.12 μm or more and 0.2 μm or less. In the present embodiment, the piezoelectric layers 10 and 19 have the same thickness, but may have different thicknesses. The plurality of piezoelectric layers 11 to 18 have the same thickness but may be different from each other.

Each of the piezoelectric layers 10 to 19 is made of a piezoelectric ceramic material. Examples of the piezoelectric ceramic material include PZT [Pb(Zr,Ti)$_3$], PT(PbTiO$_3$). PLZT[(Pb,La)(Zr,Ti)$_3$] and barium titanate (BaTiO$_3$). Each of the piezoelectric layers 10 to 19 is a sintered body of a ceramic green sheet containing a piezoelectric ceramic material. In the actual laminate 2, the piezoelectric layers 10 to 19 are integrated in such a way that boundaries between the piezoelectric layers 10 to 19 cannot be visually recognized.

The piezoelectric element 1 includes a plurality of internal electrodes 20, 30A and 30B that is disposed in the laminate 2 to generate a plurality of active regions in the laminate 2. In the piezoelectric element 1, the internal electrodes 30A and 30B serving as first internal electrodes and the internal electrode 20 serving as a second internal electrode are alternately arranged via the piezoelectric layers 10 to 19. The first internal electrode may be either of the internal electrodes 30A and 30B. However, the piezoelectric element 1 needs to have at least one internal electrode 30A and at least one internal electrode 30B. The plurality of internal electrodes 20, 30A and 30B are laminated such that the pair of internal electrodes 20 are positioned at both ends in the laminating direction (direction D3).

In the embodiment, the piezoelectric element 1 includes a plurality of internal electrodes 20, a plurality of internal electrodes 30A, and a plurality of internal electrodes 30B. Specifically, the piezoelectric element 1 includes two internal electrodes 30 disposed on the piezoelectric layers 10, 12, 14, 16 and 18, five internal electrodes 20A disposed on the piezoelectric layers 11 and 15, and two internal electrodes 30B disposed on the piezoelectric layers 13 and 17.

The plurality of internal electrodes 20 are disposed between the piezoelectric layer 10 and the piezoelectric layer 11, between the piezoelectric layer 12 and the piezoelectric layer 13, between the piezoelectric layer 14 and the piezoelectric layer 15, between the piezoelectric layer 16 and the piezoelectric layer 17, and between the piezoelectric layer 18 and the piezoelectric layer 19, respectively. The plurality of internal electrodes 30A are disposed between the piezoelectric layer 11 and the piezoelectric layer 12, and between the piezoelectric layer 15 and the piezoelectric layer 16, respectively. The plurality of internal electrodes 30B are disposed between the piezoelectric layer 13 and the piezoelectric layer 14, and between the piezoelectric layer 17 and the piezoelectric layer 18, respectively.

The internal electrode 30A disposed on the piezoelectric layer 11 opposes the internal electrode 20 via the piezoelectric layer 11 and opposes the internal electrode 20 via the piezoelectric layer 12. The internal electrode 30B disposed on the piezoelectric layer 13 opposes the internal electrode 20 via the piezoelectric layer 13 and opposes the internal electrode 20 via the piezoelectric layer 14. The internal electrode 30A disposed on the piezoelectric layer 15 opposes the internal electrode 20 via the piezoelectric layer 15 and opposes the internal electrode 20 via the piezoelectric layer 16. The internal electrode 30B disposed on the piezoelectric layer 17 opposes the internal electrode 20 via the piezoelectric layer 17 and opposes the internal electrode 20 via the piezoelectric layer 18.

Each of the internal electrodes 20, 30A and 30B includes a conductive material (for example, Ag/Pd, Pt, Pd, or Cu). Each of the internal electrodes 20, 30A and 30B is formed as a sintered body of a conductive paste containing the conductive material.

Figure 5:
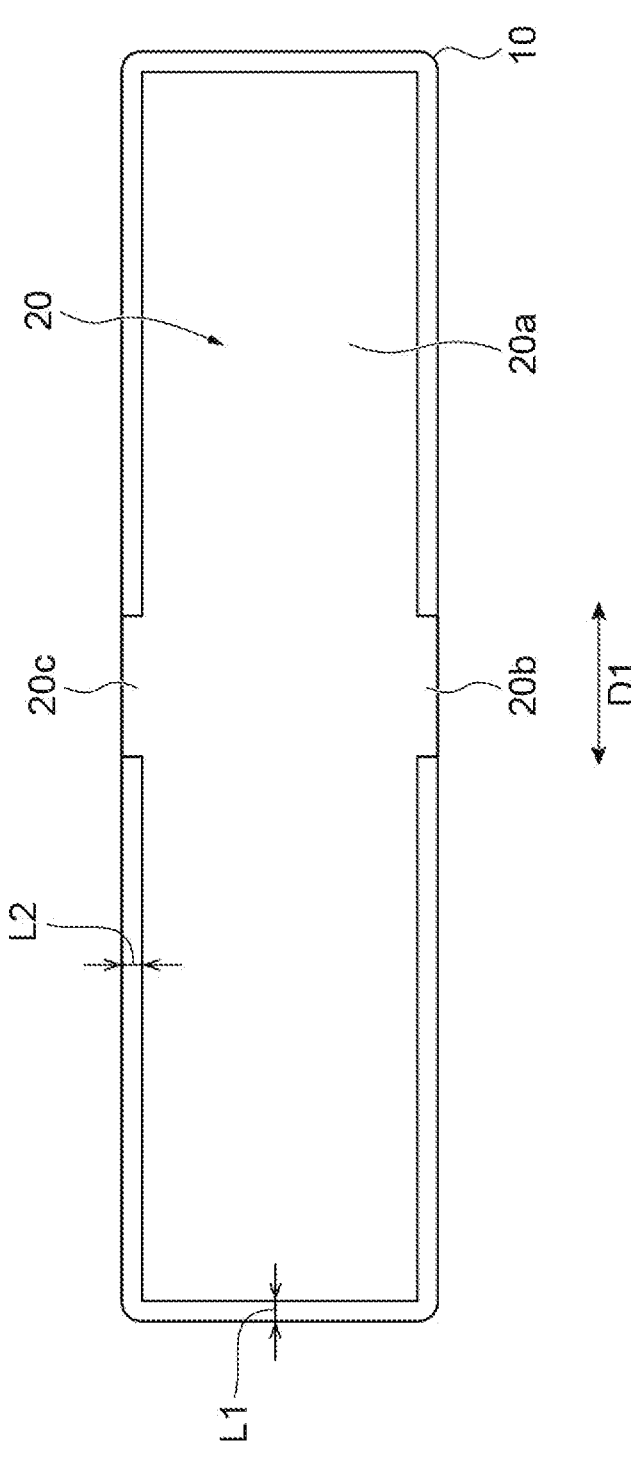
FIG. 5 is a plan view showing an internal electrode disposed on a piezoelectric layer.

FIG. 5 is a plan view showing the internal electrode 20 disposed on the piezoelectric layer 10. As shown in FIG. 5, the internal electrode 20 includes a main electrode part 20a and connecting parts 20b and 20c connecting the main electrode part 20a and the external electrodes 6 and 9. The external electrodes 6 and 9 correspond to the main electrode part 20a. The main electrode part 20a has a rectangular shape in which the longitudinal direction of the laminate 2 is the longitudinal direction of the main electrode part 20a. The main electrode part 20a is spaced apart from each end face 2a and 2b by a distance L1. The main electrode part 20a is spaced apart from the side faces 2c and 2d by a distance L2. The distance L1 and the distance L2 are, for example, equal to each other. The distances L1 and L2 are, for example, 0.02 mm or more and 0.25 mm or less.

As also shown in FIG. 2, the connecting part 20b extends from one side face along the longitudinal direction (direction D1) of the main electrode part 20a toward the side face 2c of the laminate 2, and is exposed at the ridge portion 2g between the side face 2c and the main face 2e of the laminate 2. The connecting part 20b is located at the center of the laminate 2 in the longitudinal direction (direction D1). The connecting part 20c extends from the other side face along the longitudinal direction of the main electrode part 20a to the side face 2d side of the laminate 2, and is exposed at the ridge portion 2g between the side face 2d and the main face 2e of the laminate 2. The connecting part 20c is located at the center of the laminate 2 in the longitudinal direction.

Figure 6:
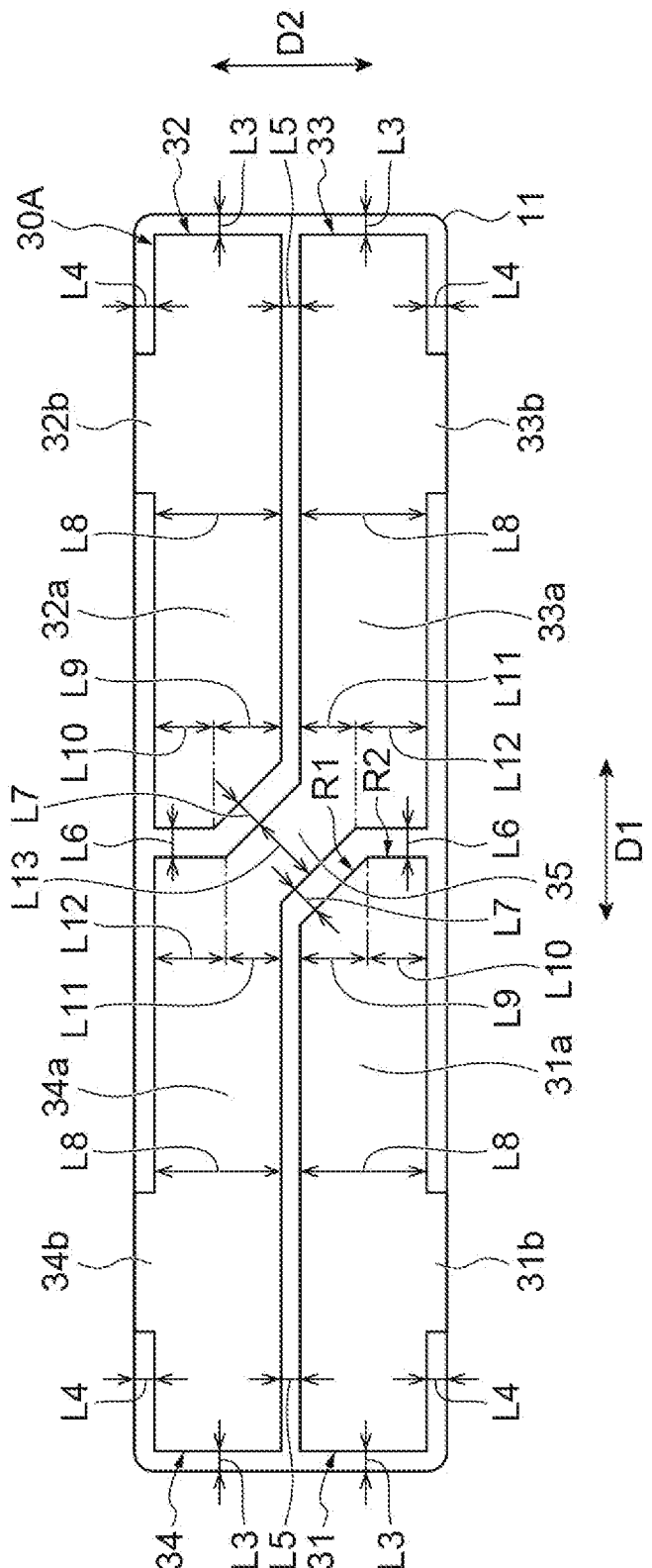
FIG. 6 is a plan view showing an internal electrode disposed on a piezoelectric layer.
Figure 7:
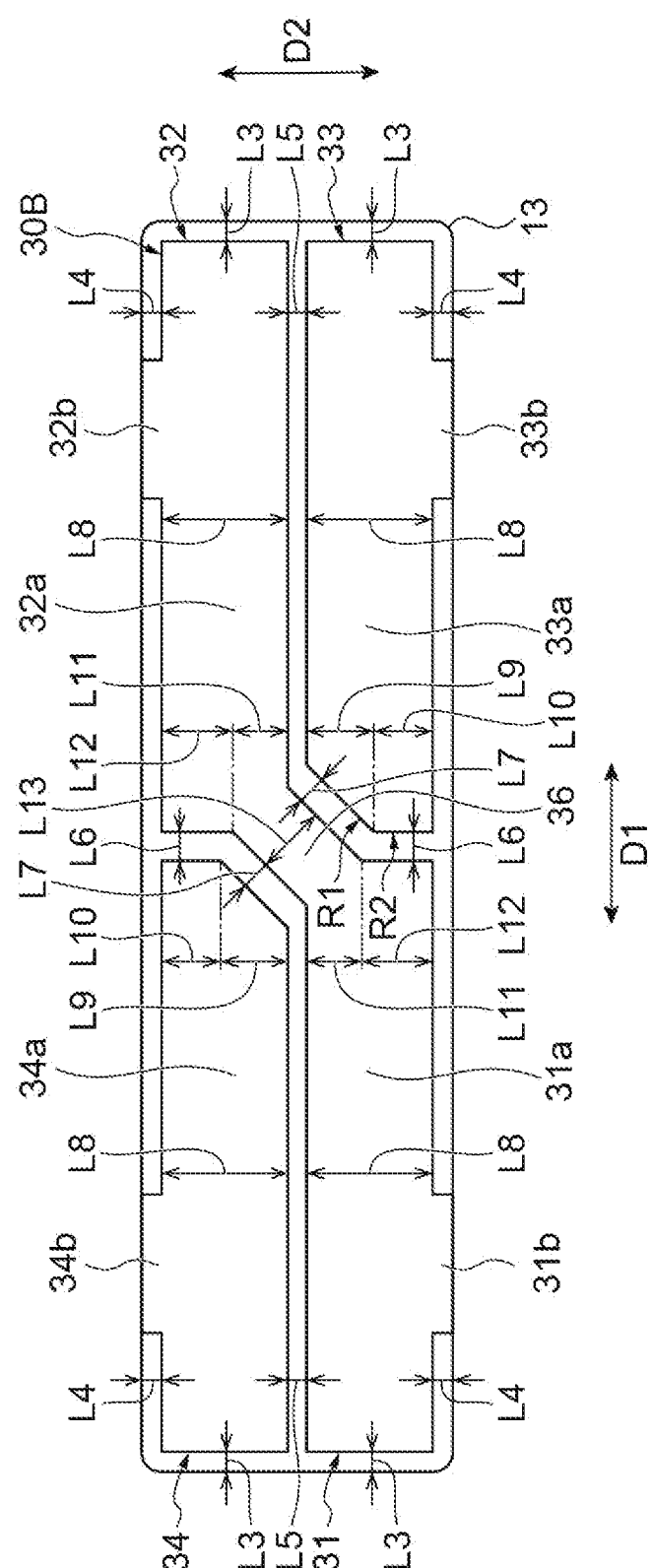
FIG. 7 is a plan view showing an internal electrode disposed on a piezoelectric layer.

The internal electrodes 20 having the same shape as that of the piezoelectric layer 10 are disposed on the piezoelectric layers 12, 14, 16 and 18. Each internal electrode 20 opposes a plurality of electrode portions 31, 32, 33 and 34 via the piezoelectric layers 11 to 18, and functions as a common electrode. As shown in FIGS. 6 and 7, a plurality of electrode portions 31, 32, 33 and 34 are included in the internal electrodes 30A and 30B.

In the internal electrodes 20 disposed on the piezoelectric layers 12, 14 and 16, the connecting part 20b is exposed at the side face 2c of the laminate 2, and the connecting part 20c is exposed at the side face 2d of the laminate 2. In the internal electrode 20 disposed on the piezoelectric layer 18, the connecting part 20b is exposed at the ridge portion 20g between the side face 2c and the main face 2f of the laminate 2, and the connecting part 20c is exposed at the ridge portion 20g between the side face 2d and the main face 2f of the laminate 2. The connecting part 20b of each internal electrode 20 is connected to the external electrode 6. The connecting part 20c of each internal electrode 20 is connected to the external electrode 9. The internal electrode 20 disposed on the piezoelectric layer 10, 18 is connected to the corresponding external electrodes 6 and 9 at the ridge portion 20g. The internal electrodes 20 disposed on the piezoelectric layers 12, 14 and 16 are connected to the external electrodes 6 and 9 at the side faces 2c and 2d.

FIG. 6 is a plan view showing the internal electrode 30A disposed on the piezoelectric layer 11. As shown in FIG. 6, the internal electrode 30A includes four electrode portions 31, 32, 33 and 34 and a connector 35. An internal electrode 30A having the same shape as that on the piezoelectric layer 11 is also disposed on the piezoelectric layer 15.

The electrode portions 31, 32, 33 and 34 are arranged in a matrix of two rows in each of the directions D1 and D2. The electrode portions 31 and 33 are arranged along the direction D1 on the side face 2c side. The electrode portions 32 and 34 are arranged along the direction D1 on the side face 2d side. The electrode portions 31 and 34 are arranged along the direction D2 on the end face 2a side. The electrode portions 32 and 33 are arranged along the direction D2 on the end face 2b side.

The electrode portions 31, 32, 33 and 34 are disposed in each of four divided regions. The four regions are obtained by dividing the piezoelectric layer 11 into two regions in each of the direction D1 and the direction D2. The electrode portions 31 and 32 are positioned diagonally to each other. The electrode portions 33 and 34 are positioned diagonally to each other. The electrode portions 31 and 32 are spaced apart from each other on the piezoelectric layer 11. The electrode portions 33 and 34 are connected to each other by a connector 35 on the piezoelectric layer 11.

The electrode portion 31 is disposed on the piezoelectric layer 11 at the corner portion side formed by the end face 2a and the side face 2c of the laminate 2. The electrode portion 31 includes a main electrode part 31a and a connecting part 31b connecting the main electrode part 31a and the corresponding external electrode 4. The main electrode part 31a and the connecting part 31b are integrally formed. The main electrode part 31a has a substantially rectangular shape and is spaced apart from the end faces 2a and 2b and the side faces 2c and 2d. The connecting part 31b extends from the main electrode part 31a toward the side face 2c to be exposed at the side face 2c.

The electrode portion 32 is disposed on the piezoelectric layer 11 at the corner portion side formed by the end face 2b and the side face 2d of the laminate 2. The corner portion at which the electrode portion 32 is disposed and the corner portion at which the electrode portion 31 are positioned diagonally to each other. The electrode portion 32 includes a main electrode part 32a and a connecting part 32b connecting the main electrode part 32a and the corresponding external electrode 8. The main electrode part 32a and the connecting part 32b are integrally formed. The main electrode part 32a has a substantially rectangular shape and is spaced apart from the end faces 2a and 2b and the side faces 2c and 2d. The connecting part 32b extends from the main electrode part 32a toward the side face 2d to be exposed at the side face 2d.

The electrode portion 33 is disposed on the piezoelectric layer 11 on the corner portion side formed by the end face 2b and the side face 2c of the laminate 2. The electrode portion 33 includes a main electrode part 33a and a connecting part 33b connecting the main electrode part 33a and the corresponding external electrode 5. The main electrode part 33a and the connecting part 33b are integrally formed. The main electrode part 33a has a substantially rectangular shape and is spaced apart from the end faces 2a and 2b and the side faces 2c and 2d. The connecting part 33b extends from the main electrode part 33a toward the side face 2c to be exposed at the side face 2c.

The electrode portion 34 is disposed on the piezoelectric layer 11 at the corner portion side formed by the end face 2a and the side face 2d of the laminate 2. The corner portion at which the electrode portion 34 is disposed and the corner portion at which the electrode portion 33 are positioned diagonally to each other. The electrode portion 34 includes a main electrode part 34a and a connecting part 34b connecting the main electrode part 34a and the corresponding external electrode 7. The main electrode part 34a and the connecting part 34b are integrally formed. The main electrode part 34a has a substantially rectangular shape and is spaced apart from the end faces 2a and 2b and the side faces 2c and 2d. The connecting part 34b extends from the main electrode part 34a toward the side face 2d to be exposed at the side face 2d.

Each main electrode part 31a and 34a is disposed to be spaced apart from the end face 2a by a distance L3. Each main electrode part 32a and 33a is disposed to be spaced apart from the end face 2b by the distance L3. That is, each of the distance between the main electrode part 31a and the end face 2a, the distance between the main electrode part 32a and the end face 2b, the distance between the main electrode part 33a and the end face 2b, and the distance between the main electrode part 34a and the end face 2a is the distance L3. These distances are, for example, average values at a plurality of positions. The distance L3 is, for example, equal to the distance L1. The distance L3 may be not shorter than the distance L1.

Each main electrode part 31a and 33a is disposed to be spaced apart from the side face 2c by a distance L4. Each main electrode part 32a and 34a is disposed to be spaced apart from the side face 2d by the distance L4. That is, each of the distance between the main electrode part 31a and the side face 2c, the distance between the main electrode part 32a and the side face 2d, the distance between the main electrode part 33a and the side face 2c, and the distance between the main electrode part 34a and the side face 2d is the distance L4. These distances are, for example, average values at a plurality of positions. The distance L4 is, for example, equal to the distance L2. The distance L4 may be not shorter than the distance L2.

The main electrode parts 31a and 34a adjacent to each other in the direction D2 are spaced apart from each other by a distance L5. The main electrode parts 32a and 33a adjacent to each other in the direction D2 are spaced apart from each other by the distance L5. Each of the distance between the main electrode part 31a and the main electrode part 34a and the distance between the main electrode part 32a and the main electrode part 33a is the distance L5. These distances are, for example, average values at a plurality of positions. The distances L3, L4, and L5 are, for example, equal. Each of the distances L3 and L4 is, for example, 0.02 mm or more and 0.25 mm or less. The distance L5 is, for example, 0.05 mm or more and 0.25 mm or less.

The main electrode parts 31a and 33a adjacent to each other in the direction D1 are spaced apart from each other by a distance L6. The main electrode parts 32a and 34a adjacent to each other in the direction D1 are spaced apart from each other by the distance L6. That is, each of the distance between the main electrode part 31a and the main electrode part 33a and the distance between the main electrode part 32a and the main electrode part 34a is the distance L6. These distances are, for example, average values at a plurality of positions. The distance L6 is longer than the distances L3, L4 and L5. The distance L6 is, for example, 0.01 mm or more and 0.3 mm or less.

The connector 35 electrically and physically connects a pair of electrode portions 33 and 34 of the four electrode portions 31, 32, 33 and 34. The pair of electrode portions 33 and 34 are positioned diagonally. Specifically, the connector 35 electrically and physically connects the main electrode part 33a of the electrode portion 33 and the main electrode part 34a of the electrode portion 34. The connector 35 is spaced apart from each of another pair of electrode portions 31 and 32 of the four electrode portions 31, 32, 33 and 34 by a distance L7. Each of the distance between the main electrode part 31a and the connector 35 and the distance between the main electrode part 32a and the connector 35 is the distance L7. These distances are, for example, average values at a plurality of positions.

The distance L7 is longer than the distances L3, L4, and L5. The distance L7 is 1.2 times or more the distances L3, L4 and L5. The distance L7 is ⅓ times or more and less than 1 times a width L13 of the connector 35. The distance L7 is, for example, 0.01 mm or more and 0.3 mm or less. The distance L7 is equal to the distance L6.

The connector 35 is disposed at the center of the piezoelectric layer 11 in the directions D1 and D2. The connector 35 is disposed between the electrode portion 31 and the electrode portion 32. The connector 35 extends in a direction inclined with respect to the direction D1 and the direction D2 when viewed from the direction D3. The width L13 of the connector 35 (a length in a direction orthogonal to the extending direction of the connector 35 when viewed from the direction D3) is, for example, 1.3 mm or more and 1.8 mm or less. The width L13 is, for example, an average value at a plurality of positions.

The main electrode part 31a includes a side portion on the electrode portion 33 side (closer to the center in the direction D1). The main electrode part 32a includes a side portion on the electrode portion 34 side (closer to the center in the direction D1). Each of the side portions includes a region R1 inclined with respect to the directions D1 and D2 along the connector 35 and a region R2 along the direction D2 when viewed from the direction D3. A length L8 of each the main electrode parts 31a, 32a, 33a and 34a in the direction D2 is, for example, 0.89 mm or more and 1.16 mm or less. A length L9 of the region R1 in the direction D2 is, for example, 0.9 times or more and 1.1 or less times a length L10 of the region R2 in the direction D2. The length L9 is, for example, 0.4 mm or more and 0.6 mm or less. The length L10 is, for example, 0.43 mm or more and 0.63 mm or less. The main electrode part 33a includes a side portion on the electrode portion 31 side (closer to the center in direction D1). The main electrode part 34a includes a side portion on the electrode portion 32 side (closer to the center in direction D1). Each of the side portions includes a first region connected to connector 35 and a second region, which is a region other than the first area, when viewed from the direction D3. A length L11 of the first region in direction D2 is, for example, 0.6 times or more and 0.8 times or less a length L12 of the second region other in direction D2. The length L11 is, for example, 0.3 mm or more and 0.6 mm or less. The length L12 is, for example, 0.5 mm or more and 0.7 mm or less.

The lengths of the connecting parts 20b, 20c, 31b, 32b, 33b and 34b in the direction D1 are, for example, equal to each other and are 0.9 mm or more and 1.4 mm or less. The lengths of the connecting parts 20b, 20c, 31b, 32b, 33b and 34b in the direction D1 are equal to or less than to the lengths of the external electrodes 4, 5, 6, 7, 8 and 9 in the direction D1. As a result, since the exposed portion of the internal electrode is protected by the external electrode, it is possible to prevent the solder used for connecting a flexible printed substrate (FPC) or the like to the external electrode from penetrating into the internal electrode side (solder leaching of the internal electrode).

FIG. 7 is a plan view showing the internal electrode 30B disposed on the piezoelectric layer 13. As shown in FIG. 7, the internal electrode 30B is different from the internal electrode 30A in that a connector 36 is included instead of the connector 35 (see FIG. 6). The connector 36 electrically and physically connects a pair of electrode portions 31 and 32 of the four electrode portions 31, 32, 33 and 34. The pair of electrode portions 31 and 32 are positioned diagonally. Specifically, the connector 36 electrically and physically connects the main electrode part 31a of the electrode portion 31 and the main electrode part 32a of the electrode portion 32.

The connector 36 is spaced apart from each of another pair of electrode portions 33 and 34 of the four electrode portions 31, 32, 33 and 34 by the distance L7. Each of the distance between the main electrode part 33a and the connector 36 and the distance between the main electrode part 34a and the connector 36 is the distance L7. These distances are, for example, average values at a plurality of positions.

The connector 36 is disposed at the center of the piezoelectric layer 13 in the directions D1 and D2. The connector 36 is disposed between the electrode portion 33 and the electrode portion 34. The connector 36 extends in a direction inclined with respect to the direction D1 and the direction D2 when viewed from the direction D3. The width of the connector 36 (a length in the direction orthogonal to the extending direction of the connector 36) is, for example, equal to the width L13.

In the internal electrode 30B, not the main electrode parts 31a and 32a, but the main electrode parts 33a and 34a include the regions R1 and R2. The main electrode part 33a includes a side portion of on the electrode portion 31 side (closer to the center in the direction D1). The main electrode part 34a includes a side portion on the electrode portion 32 side (closer to the center in the direction D1). Each of the side portions includes the region R1 inclined with respect to the directions D1 and D2 along the connector 36 and the region R2 along the direction D2 when viewed from the direction D3. The length L9 of the region R1 in the direction D2 and the length L10 of the region R2 in the direction D2 are the same as those of the internal electrode 30A. That is, the length L9 is 0.9 or more times and 1.1 or less times the length L10. The length L9 is, for example, 0.4 mm or more and 0.6 mm or less. The length L10 is, for example, 0.43 mm or more and 0.63 mm or less. The main electrode part 31a include a side portion on the electrode portion 33 side (closer to the center in the direction D1). The main electrode part 32a include a side portion on the electrode portion 34 side (closer to the center in direction D1). Each of the side portions includes the first region connected to the connector 36 and the second region. The length L11 of the first region in direction D2 is, for example, 0.6 times or more and 0.8 times or less the length L12 of the second region in direction D2. The length L11 is, for example, 0.3 mm or more and 0.6 mm or less. The length L12 is, for example, 0.5 mm or more and 0.7 mm or less.

In each of the internal electrodes 30A and 30B, the plurality connecting parts 31b are connected to the external electrode 4 at the side face 2c. The plurality of electrode portions 31 are electrically connected to each other via the external electrode 4. The plurality of connecting parts 32b are connected to the external electrode 8 at the side face 2d. The plurality of electrode portions 32 are electrically connected to each other via the external electrode 8. The plurality of connecting parts 33b are connected to the external electrode 5 at the side face 2c. The plurality of electrode portions 33 are electrically connected to each other via the external electrode 5. The plurality of connecting parts 34b are connected to the external electrode 7 at the side face 2d. The plurality of electrode portions 34 are electrically connected to each other via the external electrode 7.

As described above, in the internal electrode 30A, the electrode portions 33 and 34 are connected to each other via the connector 35. In the internal electrode 30B, the electrode portions 31 and 32 are connected to each other via the connector 36. Therefore, all the electrode portions 31 and 32 are electrically connected to each other via the connector 36, the external electrode 4 and the external electrode 8. All the electrode portions 33 and 34 are electrically connected to each other via the connector 35, the external electrode 5 and the external electrode 7.

An example of a method of manufacturing the piezoelectric element 1 will be described. First, a ceramic paste for forming the piezoelectric layers 10 to 19 and a conductive paste for forming the internal electrodes 20, 30A and 30B are prepared. The ceramic paste includes, for example, the above-described piezoelectric ceramic material and an organic vehicle. The conductive paste includes, for example, a powder of the above-described conductive material and an organic vehicle. The organic vehicle includes a binder and a solvent. The solvent is, for example, an organic solvent.

Next, a ceramic green sheet is formed using the above-described ceramic paste. In this process, for example, after the ceramic paste is applied in a sheet shape onto the carrier film, the sheet-shaped ceramic paste is dried. Thus, a ceramic green sheet is obtained. The ceramic paste is applied by, for example, a doctor blade method. Next, a plurality of internal electrode patterns is formed on the ceramic green sheet using a conductive paste. In this process, for example, after the conductive paste is applied in a pattern shape onto the ceramic green sheet, the conductive paste is dried. Thus, a plurality of internal electrode patterns is obtained. The internal electrode paste is applied by, for example, a screen printing method.

Next, the ceramic green sheets on which the internal electrode patterns are formed are laminated to form a green laminate. The green laminate is then fired. Thus, a laminate substrate is formed. The laminate substrate is then diced. In this process, for example, the laminate substrate is cut into chips by a cutting machine. Thus, a plurality of laminates having a predetermined size are obtained. Next, the laminate is subjected to round chamfering. The round chamfering is, for example, barrel polishing. As a result, a laminate 2 including the ridge portions 2g and the corner portions 2h which are rounded is obtained.

Next, the external electrodes 4, 5, 6, 7, 8 and 9 are formed on the side faces 2c and 2d. In this process, the external electrodes 4, 5, 6, 7, 8 and 9 are formed by, for example, a sputtering method. Thereafter, the laminate 2 is polarized. Thus, the piezoelectric element 1 is completed.

In the piezoelectric element 1 configured as described above, for example, different voltages are applied to the external electrodes 4, 5 and 6 by a wiring member disposed on the side face 2c. As an example, the external electrode 6 is connected to the ground, and voltages whose phases are shifted by 900 with each other are applied to the external electrodes 4 and 5. As a result, a plurality of piezoelectrically active regions are formed in laminate 2. The plurality of active regions are formed corresponding to the electrode portion 31, 32, 33 and 34.

Specifically, among the piezoelectric layers 11 to 18, a region overlapping the electrode portion 31, 32, 33 and 34 when viewed from the direction D3 is the active region. Among the piezoelectric layers 11 to 18, regions sandwiched between the main electrode part 31a of the electrode portion 31 and the main electrode part 20a of the internal electrode 20, between the main electrode part 32a of the electrode portion 32 and the main electrode part 20a of the internal electrode 20, between the main electrode part 33a of the electrode portion 33 and the main electrode part 20a of the internal electrode 20, and between the main electrode part 34a of the electrode portion 34 and the main electrode part 20a of the internal electrode 20 are active regions.

The piezoelectric element 1 has two resonance modes during driving. The piezoelectric element 1 vibrates by the superposing a longitudinal vibration mode vibrating in the direction D1 and a bending vibration mode in the direction D2. In the piezoelectric element 1, for example, the active region corresponding to the electrode portions 31 and 32 and the active region corresponding to the electrode portions 33 and 34 are displaced in opposite directions along the direction D1. That is, one active region is extended along the direction D1, and the other active region is contracted along the direction D1. Accordingly, the piezoelectric element 1 bends and vibrates in an S-shape when viewed from the direction D3.

Figure 8:
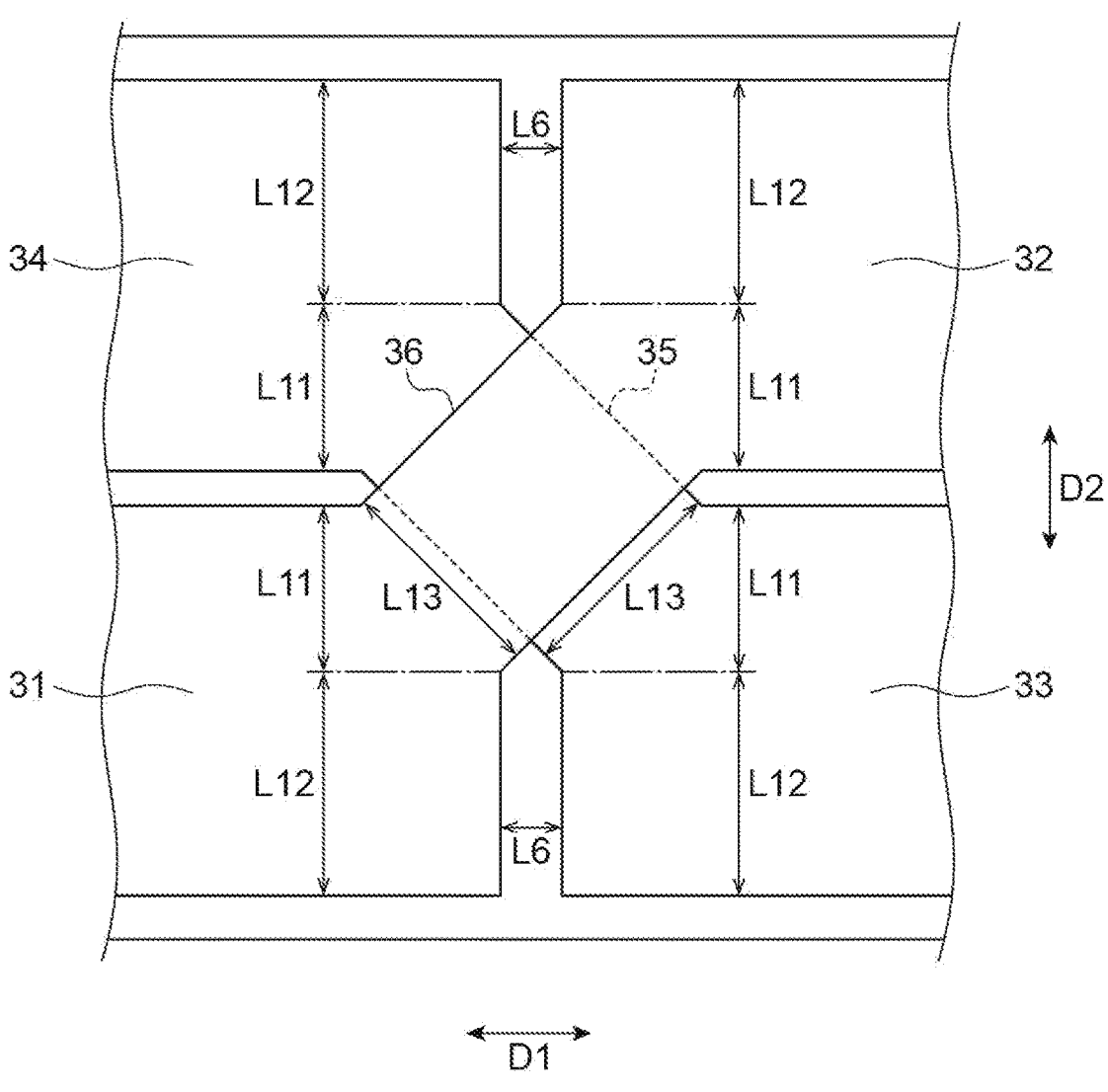
FIG. 8 is a view showing a state in which connecting electrodes are overlapped with each other.

FIG. 8 is a view showing a state in which the connecting electrodes overlap each other. FIG. 8 shows the electrode portions 33 and 34 and the connector 35 of the internal electrode 30A and the electrode portions 31 and 32 and the connector 36 of the internal electrode 30B. Here, a state in which the connector 35 is disposed in front of the connector 36 is shown. As shown in FIG. 8, when viewed from the direction D3, the connector 35 and the connector 36 overlap each other. Among the piezoelectric layers 11 to 18, a region overlapping the connectors 35 and 36 when viewed from the direction D3 is also an active region.

As described above, since the internal electrode 30A includes the connector 35 and the internal electrode 30B includes the connector 36, not only the regions overlapping the main electrode parts 31a, 32a, 33a and 34a when viewed from the direction D3, but also the regions overlapping the connectors 35 and 36 are piezoelectrically active regions in the piezoelectric layers 11 to 18. The regions overlapping with the connectors 35 and 36 serves as a node (non-displaced portion) of bending vibration of the piezoelectric element 1. Nevertheless, if the regions overlapping the connectors 35 and 36 vibrates as the active region, the vibration of the active regions caused by the main electrode parts 31a, 32a, 33a and 34a may be inhibited.

In the piezoelectric element 1, the distance L7 is longer than each of the distances L3 and L4. Therefore, compared to a case where the distance L7 is equal to or less than each of the distances L3 and L4, the vibration of the active region caused by the connectors 35 and 36 can be suppressed. As a result, it is suppressed that the vibration of the active region caused by the main electrode parts 31a, 32a, 33a and 34a is inhibited, and thus the displacement amount can be improved.

The connector 35 connects the electrode portions 31 and 32. The connector 36 connects the electrode portions 33 and 34. This makes it possible to reduce the number of wires connected to the external electrodes 4 to 9 in order to apply voltages to the external electrodes 4 to 9. In addition, it is not necessary to provide a connecting electrode for connecting the electrode portions 31 and 32 and a connecting electrode for connecting the electrode portions 33 and 34 outside the laminate 2. For example, when a wiring is connected to each of the external electrodes 4 to 9, both of the side faces 2c and 2d are constrained by the wiring member. Therefore, the vibration of the piezoelectric element 1 is easily inhibited. When a connecting electrode is disposed outside the laminate 2, it is easily affected by external conductive particles. In particular, when a connecting electrode is disposed on the main faces 2e and 2f, an active region is generated due to the connecting electrode. Then the active region may inhibit vibration of the active region caused by the main electrode parts 31a. 32a, 33a and 34a.

As described above, since the internal electrodes 30A and 30B are configured to include the connectors 35 and 36, it is suppressed that the vibration of the piezoelectric element 1 is inhibited by the wiring and the connecting electrode. As a result, the displacement amount can be further improved. In a configuration in which the internal electrodes 30A and 30B do not include the connectors 35 and 36, the problem of the active region caused by the connectors 35 and 36 does not occur. However, vibration inhibition by the wiring and the connecting electrode is not suppressed. As a result, the displacement amount cannot be improved.

The distance L7 is ½ times or more and less than 1 times the width L13 of the connectors 35 and 36. When the distance L7 is ½ times or more the width L13, the active regions caused by the connectors 35 and 36 and can be sufficiently spaced apart from the active regions caused by the main electrode parts 31a, 32a, 33a and 34a. When the distance L7 is less than 1 times the width L13 of the connectors 35 and 36, the size of the active region caused by the main electrode parts 31a, 32a, 33a and 34a is easily ensured.

The pair of main electrode parts 33a and 31a adjacent to each other in the direction D1 are spaced apart from each other by the distance L6. The pair of main electrode parts 34a and 32a adjacent to each other in the direction D1 are spaced apart from each other by the distance L6. The distance L6 is longer than each of the distances L3 and L4. Therefore, sufficient gaps can be left between the pair of main electrode parts 31a and 33a adjacent to each other and between the pair of main electrode parts 32a and 34a adjacent to each other. Accordingly, the portions of the piezoelectric layers 11 to 18 corresponding to the gaps serve as nodes of bending vibration. As a result, the piezoelectric element 1 can be stably subjected to bending vibration.

The pair of main electrode parts 31a and 34a adjacent to each other in the direction D2 are spaced apart from each other by the distance L5. The pair of main electrode parts 32a and 33a adjacent to each other in the direction D2 are spaced apart from each other by the distance L5. The distance L5 is equal to the distances L3 and L4. The distances L3 and L4 are shorter than the distance L1. Therefore, the distance L5 is also shorter than the distance L1. Therefore, the size of the active region caused by the main electrode parts 31a, 32a, 33a and 34a is easily ensured.

The distance L7 is longer than the distance L5. Therefore, compared to the case where the distance L7 is equal to or less than the distance L5, the vibration of the active region caused by the connectors 35 and 36 can be suppressed. Since it is suppressed that the vibration of the active region caused by the main electrode parts 31a, 32a, 33a and 34a is inhibited, the displacement amount can be improved.

In the piezoelectric element 1, the end faces 2a and 2b, the side faces 2c and 2d, and the main faces 2e and 2f are polished surfaces. According to such a polished surface, as compared with the case of a natural surface, the displacement difference between a plurality of active regions is suppressed. Accordingly, the piezoelectric element 1 can bend and vibrate in a well-balanced manner. As a result, the displacement amount of the piezoelectric element 1 can be improved.

Each ridge portion 2g of the laminate 2 has a rounded chamfered shape. Accordingly, it is possible to suppress concentration of strain on each ridge portion 2g during driving. As a result, the cracks starting from each ridge portion 2g in the laminate 2 is suppressed. The piezoelectric layers 10 and 19 disposed at the lamination ends are piezoelectrically inactive layers and inhibit displacement. Since the ridge portions 2g adjacent to the main faces 2e and 2f have chamfered shapes, it is possible to reduce the volume of the piezoelectric layers 10 and 19 that inhibits displacement. Therefore, it is easy to improve the displacement amount.

In the laminate 2, when viewed from the direction D3, in the regions outside the internal electrodes 20, 30A and 30B, that is, in the regions near the end faces 2a and 2b and the side faces 2c and 2d, the electric fields are formed so as to curve from the end portions of the internal electrodes 30A and 30B to the end portions of the adjacent internal electrodes 20. Since the ridge portion 2g has a rounded chamfered shape, it is difficult to prevent the curved electric field from flowing around as compared with the case of a flat chamfered shape.

The plurality of internal electrodes 20, 30A and 30B are laminated such that the pair of internal electrodes 20 are positioned at both ends in the laminating direction (direction D3). That is, the pair of internal electrodes 20 is adjacent to the piezoelectric layers 10 and 19. If the internal electrodes 30A and 30B including the plurality of electrode portions 31, 32, 33 and 34 are disposed at the lamination ends and are adjacent to the piezoelectric layers 10 and 19, the smoothness of the main faces 2e and 2f may be deteriorated due to the plurality of electrode portions 31, 32, 33 and 34. In particular, since the piezoelectric layers 10 and 19 are thinner than the other piezoelectric layers 11 to 18, the shapes of the plurality of electrode portions 31, 32, 33 and 34 may be reflected on the main faces 2e and 2f. On the other hand, the internal electrode 20 is a common electrode and is integrally disposed over substantially the entire piezoelectric layers 10 and 19. Therefore, in the piezoelectric element 1, a decrease in smoothness of the main faces 2e and 2f is suppressed. As a result, it is possible to suppress the displacement difference between the plurality of active regions and further improve the displacement amount.

Since the pair of internal electrodes 20 are disposed at both ends in the laminating direction, the electric fields of the internal electrodes 30A and 30B are prevented from leaking to the outside of the laminate 2 and becoming noise. Noise received from the outside is also prevented. Thus, the operation of the piezoelectric element 1 can be stabilized.

The thickness of the piezoelectric layers 10 and 19 disposed at the lamination ends is thinner than the thickness of the piezoelectric layers 11 to 18 disposed between the piezoelectric layer 10 and the piezoelectric layer 19. As described above, the piezoelectric layers 10 and 19 are piezoelectrically inactive layers and inhibit displacement. Since the thickness of the piezoelectric layers 10 and 19 which inhibits the displacement is thin, the displacement amount can be further improved.

The radius of curvature of the ridge portion 2g is greater than the thicknesses of the piezoelectric layers 10 and 19. Therefore, the internal electrodes 20 disposed at the lamination ends are exposed at the ridge portions 2g and are connected to the external electrodes 6 and 9 at the ridge portions 2g. Since the ridge portions 2g have rounded chamfered shapes, the exposed areas of the internal electrodes 20 disposed at the lamination ends are increased. Therefore, the connection strengths between the internal electrodes 20 arranged at the lamination ends and the external electrodes 6 and 9 are improved.

The present invention is not necessarily limited to the above-described embodiments, and various modifications can be made with the spirit and the scope thereof.

In the above embodiment, the laminate 2 is formed by laminating the piezoelectric layers 10 to 19. However, the number of piezoelectric layers to be laminated is not limited and may be appropriately set according to design. In the above-described embodiment, the pair of internal electrodes 20 is disposed at the lamination ends, but the internal electrodes 30A and 30B may be disposed. The internal electrodes 30A and 30B may be exposed at the ridge portion 2g. The piezoelectric layers 10 to 19 may have the same thickness.

The invention claimed is:

1. A piezoelectric element comprising:
   a laminate including a plurality of piezoelectric layers that is laminated;
   a first internal electrode and a second internal electrode disposed in the laminate and alternately laminated in a laminating direction of the plurality of piezoelectric layers via a piezoelectric layer of the plurality of piezoelectric layers; and
   a plurality of external electrodes,
   wherein the laminate includes:
      a pair of main faces facing away from each other in the laminating direction;
      a pair of end faces facing away from each other in a first direction crossing the laminating direction; and
      a pair of side faces facing away from each other in a second direction crossing the laminating direction and the first direction,
   wherein the first internal electrode includes four electrode portions and a connector,
   wherein the four electrode portions are arranged in two rows in each of the first direction and the second direction and include a first pair of electrode portions positioned diagonally to each other and a second pair of electrode portions positioned diagonally to each other,
   wherein the connector connects the first pair of electrode portions and is spaced apart from each of the second pair of electrode portions by a first distance,
   wherein each of the four electrode portions includes a main electrode part,
   wherein the main electrode part is spaced apart from the pair of end faces by a second distance and spaced apart from the pair of side faces by a third distance, and wherein the first distance is longer than each of the second distance and the third distance.

2. The piezoelectric element according to claim 1, wherein a pair of the main electrode parts adjacent to each other in the first direction are spaced apart from each other by a fourth distance, and the fourth distance is longer than each of the second distance and the third distance.

3. The piezoelectric element according to claim 1, wherein the second distance and the third distance are equal to each other.

4. The piezoelectric element according to claim 1, wherein a pair of the main electrode parts adjacent to each other in the second direction are spaced apart from each other by a fifth distance, and the fifth distance is equal to the second distance and the third distance.

5. A piezoelectric element comprising:

a laminate including a plurality of piezoelectric layers that is laminated;

a first internal electrode and a second internal electrode disposed in the laminate and alternately laminated in a laminating direction of the plurality of piezoelectric layers via a piezoelectric layer of the plurality of piezoelectric layers; and a plurality of external electrodes, wherein the laminate includes:

a pair of main faces facing away from each other in the laminating direction;

a pair of end faces facing away from each other in a first direction crossing the laminating direction; and a pair of side faces facing away from each other in a second direction crossing the laminating direction and the first direction, wherein the first internal electrode includes four electrode portions and a connector, wherein the four electrode portions are arranged in two rows in each of the first direction and the second direction and includes a first pair of electrode portions positioned diagonally to each other and a second pair of electrode portions positioned diagonally to each other, wherein the connector connects the first pair of electrode portions and is spaced apart from each of the second pair of electrode portions by a first distance, wherein each of the four electrode portions includes a main electrode part, wherein a pair of the main electrode parts adjacent to each other in the second direction are spaced apart from each other by a fifth distance, and wherein the first distance is longer than the fifth distance.

6. The piezoelectric element according to claim 1, wherein the first distance is ½ times or more and less than 1 times a width of the connector.

* * * * *